US011019738B2

(12) United States Patent
Momin et al.

(10) Patent No.: US 11,019,738 B2
(45) Date of Patent: May 25, 2021

(54) LAUNDRY APPLIANCE

(71) Applicant: WHIRLPOOL CORPORATION, Benton Harbor, MI (US)

(72) Inventors: Azhar K. Momin, Pune (IN); Sadasivam Narayanan, Salem (IN)

(73) Assignee: Whirlpool Corporation, Benton Harbor, MI (US)

( * ) Notice: Subject to any disclaimer, the term of this patent is extended or adjusted under 35 U.S.C. 154(b) by 115 days.

(21) Appl. No.: 16/252,971

(22) Filed: Jan. 21, 2019

(65) Prior Publication Data
US 2020/0236800 A1    Jul. 23, 2020

(51) Int. Cl.
*D06F 34/28* (2020.01)
*H05K 5/00* (2006.01)
*H05K 5/02* (2006.01)

(52) U.S. Cl.
CPC ........... *H05K 5/0217* (2013.01); *D06F 34/28* (2020.02); *H05K 5/0004* (2013.01); *H05K 5/0017* (2013.01)

(58) Field of Classification Search
CPC .... D06F 34/28; H05K 5/0004; H05K 5/0017; H05K 5/0217
USPC ........................................ 68/3 R, 12.01, 139
See application file for complete search history.

(56) References Cited

U.S. PATENT DOCUMENTS

| | | | |
|---|---|---|---|
| 9,359,707 B2 | 6/2016 | Bas | |
| 2005/0103061 A1 | 5/2005 | Kim | |
| 2005/0257574 A1 | 11/2005 | Lyu | |
| 2005/0257577 A1 | 11/2005 | Lyu | |
| 2006/0081015 A1 | 4/2006 | Rizzetto et al. | |
| 2013/0091904 A1 | 4/2013 | Kim et al. | |
| 2015/0043135 A1* | 2/2015 | Bas | D06F 34/28 361/679.01 |

FOREIGN PATENT DOCUMENTS

| | | |
|---|---|---|
| CN | 2523776 | 12/2002 |
| CN | 2536628 | 2/2003 |
| JP | H0312199 A | 1/1991 |

* cited by examiner

*Primary Examiner* — Levon J Shahinian
(74) *Attorney, Agent, or Firm* — Price Heneveld LLP

(57) ABSTRACT

A console assembly for an appliance is provided that includes a shell having a first face and a first rim and a first protrusion operably coupled with the first face. The first face is positioned at an incline relative to a top edge of the shell. A panel is operably coupled with the shell. The panel includes a second face and a second rim and a second protrusion extending from a side of the panel opposite the second face. The panel is positioned parallel to the first face. A plurality of electrical components are operably coupled to one of the shell and the panel.

16 Claims, 6 Drawing Sheets

LAUNDRY APPLIANCE

FIELD OF THE DISCLOSURE

The present disclosure generally relates to a console assembly, and more specifically to a console assembly for a laundry appliance.

BACKGROUND

Consoles may be used for housing and displaying electrical components for an appliance. Users may provide input through buttons, screens, or other input features on the console. The console may collect dust and need to be cleaned over time. When the console is cleaned, water may seep through seams of the console and could damage the electrical components. When the appliance is positioned outdoors, water from precipitation may also seep through the seams of the console and may cause damage to the electrical components.

SUMMARY

In at least one feature, an appliance is provided that includes a body including a top panel. A console assembly is operably coupled to the top panel of the body. The console assembly includes a shell defining a cavity. The shell includes a first rim and a first protrusion. The first rim and the first protrusion define a channel. A panel is operably coupled with the shell. The panel includes a second protrusion. The second protrusion is aligned with the first rim and the first protrusion and is positioned within the channel. A plurality of electrical components are positioned on one of the shell and the panel.

In at least another feature, an appliance is provided that includes a shell having a first face and a first rim and a first protrusion operably coupled with the first face. The first face is positioned at an incline relative to a top edge of the shell. A panel is operably coupled with the shell. The shell includes a second face and a second rim and a second protrusion extending from a side of the panel opposite the second face. The panel is positioned parallel to the first face. A plurality of electrical components are operably coupled to one of the shell and the panel.

In at least another feature, a method for deflecting fluid away from electrical components of a console assembly is provided. The method includes a step of forming a shell to have a first rim and a first protrusion extending from a first face such that the first rim and first protrusion define a first channel. The first channel is sloped from a center of the shell to sides of the shell and is inclined relative to a top edge of the shell. The method also includes a step of forming a panel to have a second rim and a second protrusion. The method further includes a step of aligning the panel with the shell such that the second rim is proximate the first rim to define a gap and the second protrusion is at least partially received by the first channel and inclined parallel to the incline of the first channel. The first rim, the first protrusion, and the second protrusion are configured to act as a labyrinth seal. The method also includes a step of coupling the panel with the shell such that the shell and the panel form said console assembly. The method includes another step of positioning a plurality of electrical components within said console assembly.

These and other features, advantages, and objects of the present device will be further understood and appreciated by those skilled in the art upon studying the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION OF EMBODIMENTS

Figure 1:
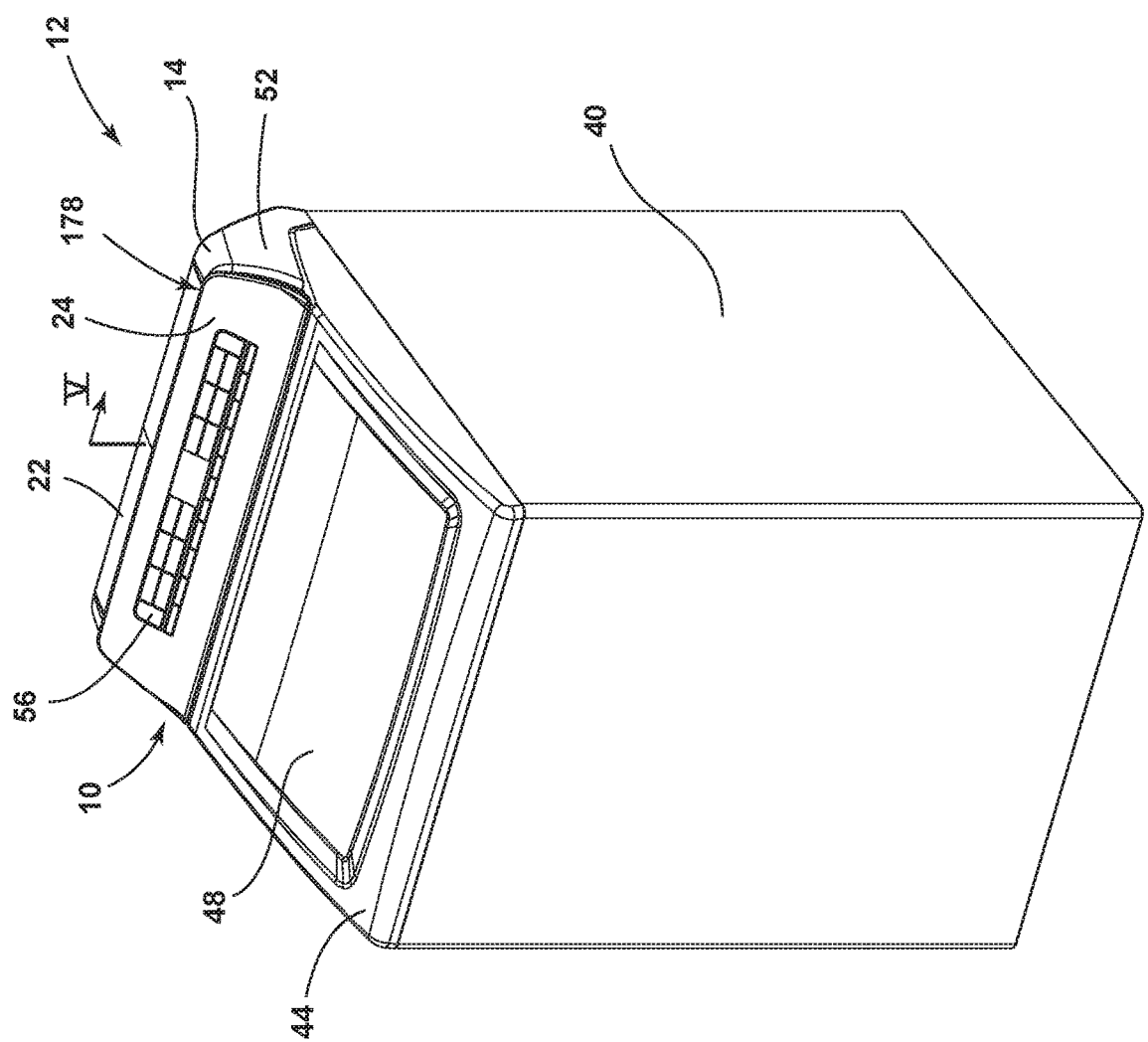
FIG. 1 is a side perspective view of an appliance with a console assembly on a top panel.

For purposes of description herein, the terms "upper," "lower," "right," "left," "rear," "front," "vertical," "horizontal," and derivatives thereof shall relate to the concepts as oriented in FIG. 1. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As required, detailed examples of the present disclosure are disclosed herein. However, it is to be understood that the disclosed examples are merely exemplary of the disclosure that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present disclosure.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises" does not, without more constraints, preclude the existence of additional identical elements in the process, method, article, or apparatus that comprises the element.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

The following disclosure describes a console assembly for an appliance. The console assembly may be used on any appliance having a top panel with an upwardly extending console. The console includes a shell positioned at an incline and a panel positioned over a face of the shell. The shell includes a channel that guides fluid along the incline of the shell and away from electrical components positioned within the console assembly.

Referring to the embodiment illustrated in FIGS. 1-6, reference numeral 10 generally designates a console assembly for an appliance 12. The console assembly 10 may include a shell 14 having a first face 16. The shell 14 may also have a first rim 18 and a first protrusion 20 operably coupled with, and typically extending from, the first face 16. The first face 16 may be positioned at an incline relative to a top edge 22 of the shell 14. A panel 24 may be operably coupled with the shell 14. The panel 24 may include a second face 26 and a second rim 28 and a second protrusion 30 extending from a side of the panel 24 opposite the second face 26. The panel 24 may be positioned parallel to or congruent with the first face 16. A plurality of electrical components 32 may be operably coupled to one of the shell 14 and the panel 24.

Referring now to FIG. 1, the appliance 12 is shown as a washing machine having a cabinet 40. The cabinet 40 may be a housing having a chassis and/or a frame, defining an interior enclosing components typically found in a conventional washing machine, such as motors, pumps, fluid lines, controls, sensors, transducers, etc. The appliance 12 includes a top panel 44 operably coupled to the cabinet 40. According to various examples, the top panel 44 may include a door 48 for loading the appliance 12. In other examples, the top panel 44 may be a continuous piece forming a top surface of the appliance 12. In still other examples, the door 48 may be coupled with the cabinet 40.

The console assembly 10 is operably coupled to the top panel 44 of the appliance 12. The console assembly 10 may include the shell 14 and the panel 24. The shell 14 may include a body portion 52. The body portion 52 may be operably coupled with the top panel 44 of the appliance 12. The panel 24 may be coupled with the shell 14 such that an end of the panel 24 is substantially flush with the top panel 44. A user interface 56 having a plurality of inputs may be positioned on the panel 24 and accessible to a user. It will be understood that the appliance 12 shown is exemplary only and that the console assembly 10 as described may be used with various other appliances, such as, for example, dryers, ovens, microwaves, dishwashers, or any other appliance that includes a console assembly having electrical components.

Figure 2:
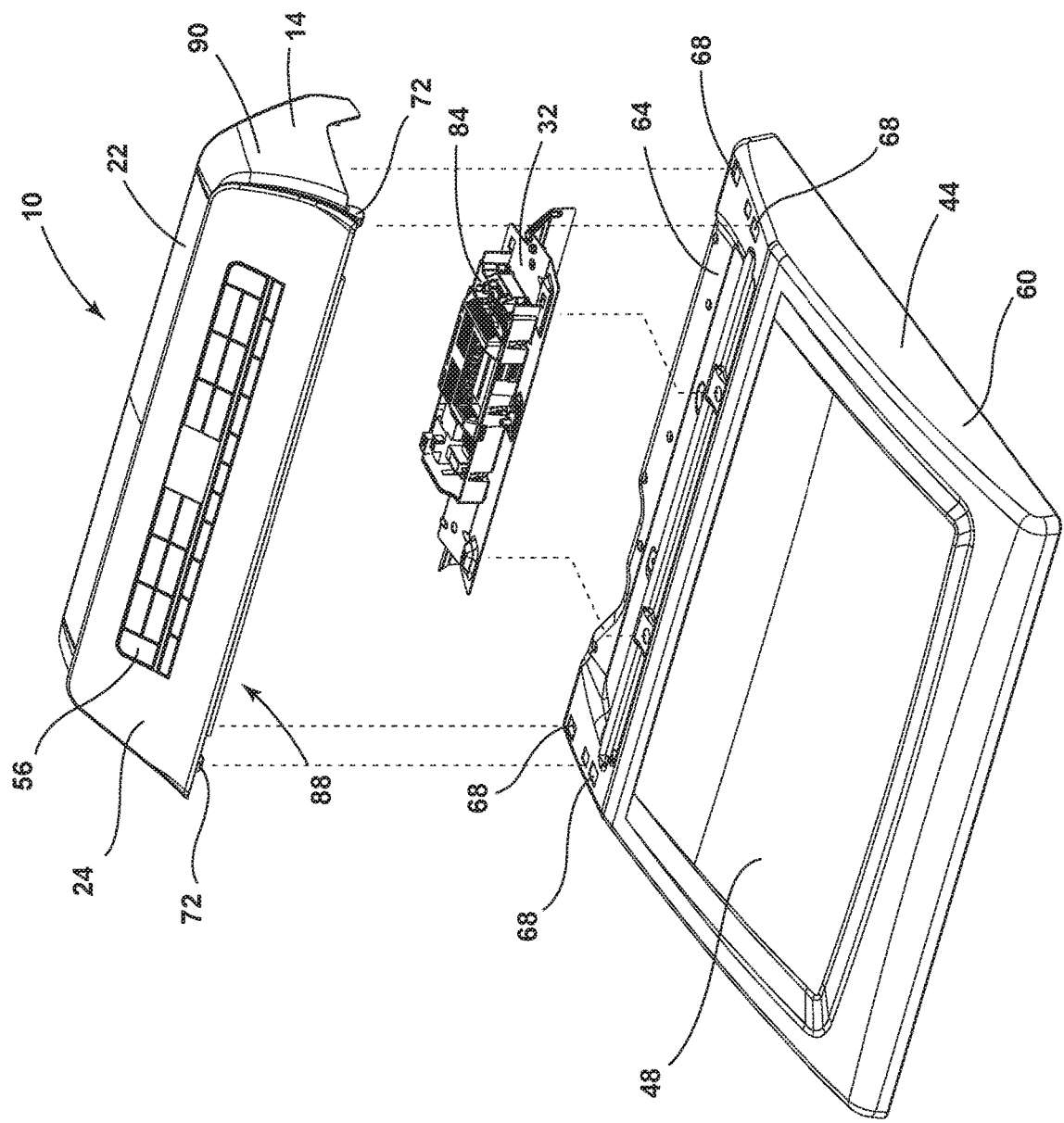
FIG. 2 is an exploded side perspective view of the console assembly and the top panel of FIG. 1.
Figure 3:
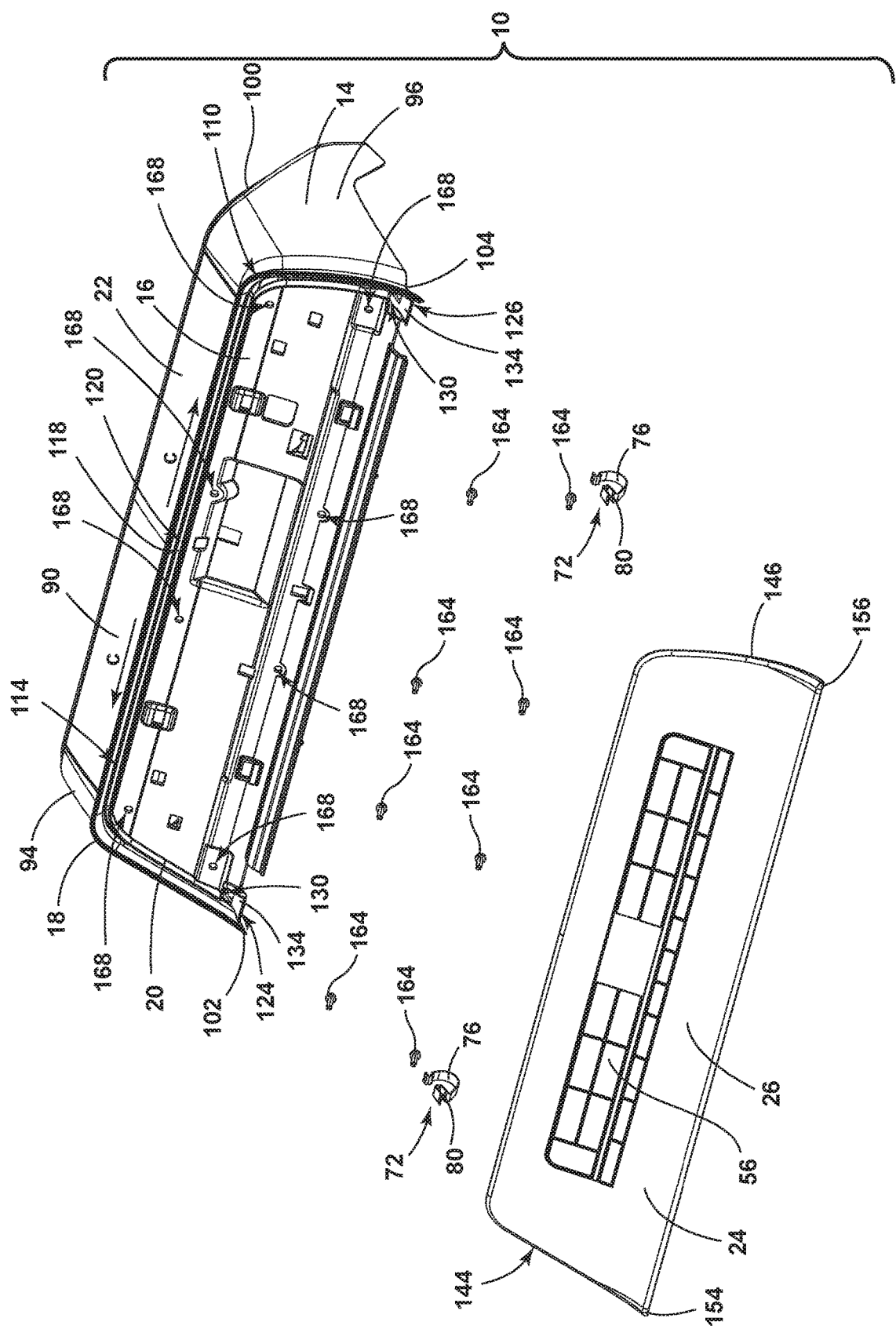
FIG. 3 is an exploded front perspective view of the console assembly of FIG. 1.

Referring now to FIGS. 2 and 3, the console assembly 10 is shown detached from the top panel 44. The top panel 44 may include a primary portion 60 and a connection portion 64. The connection portion 64 may be integrally formed with the primary portion 60 and may be positioned rearward of the primary portion 60. The connection portion 64 may define a plurality of connection apertures 68 configured to receive clips 72 of the console assembly 10. As shown in FIG. 3, the clips 72 may be flexible tabs having a resilient portion 76. The resilient portion 76 may include a top edge 80 and sides tapering from the top edge 80 to a radiused corner. The radiused corner and tapered sides allow the resilient portion 76 of the respective clip 72 to be received by and snap through the connection apertures 68 of the connection portion 64 of the top panel 44 to couple the console assembly 10 with the top panel 44.

The connection portion 64 may further be coupled to a first portion 84 of the plurality of electrical components 32. The first portion 84 of the plurality of electrical components 32 may include a central control unit for the appliance 12. The central control unit may be operably coupled with various components of the appliance to implement a cycle of operation. The first portion 84 of the plurality of electrical components 32 may be positioned within a cavity 88 defined by the shell 14 when the console assembly 10 is coupled with the connection portion 64 of the top panel 44. It will be understood that various electrical components may be included in the first portion 84 of the plurality of electrical components 32 without departing from the scope of the present disclosure.

Figure 4:
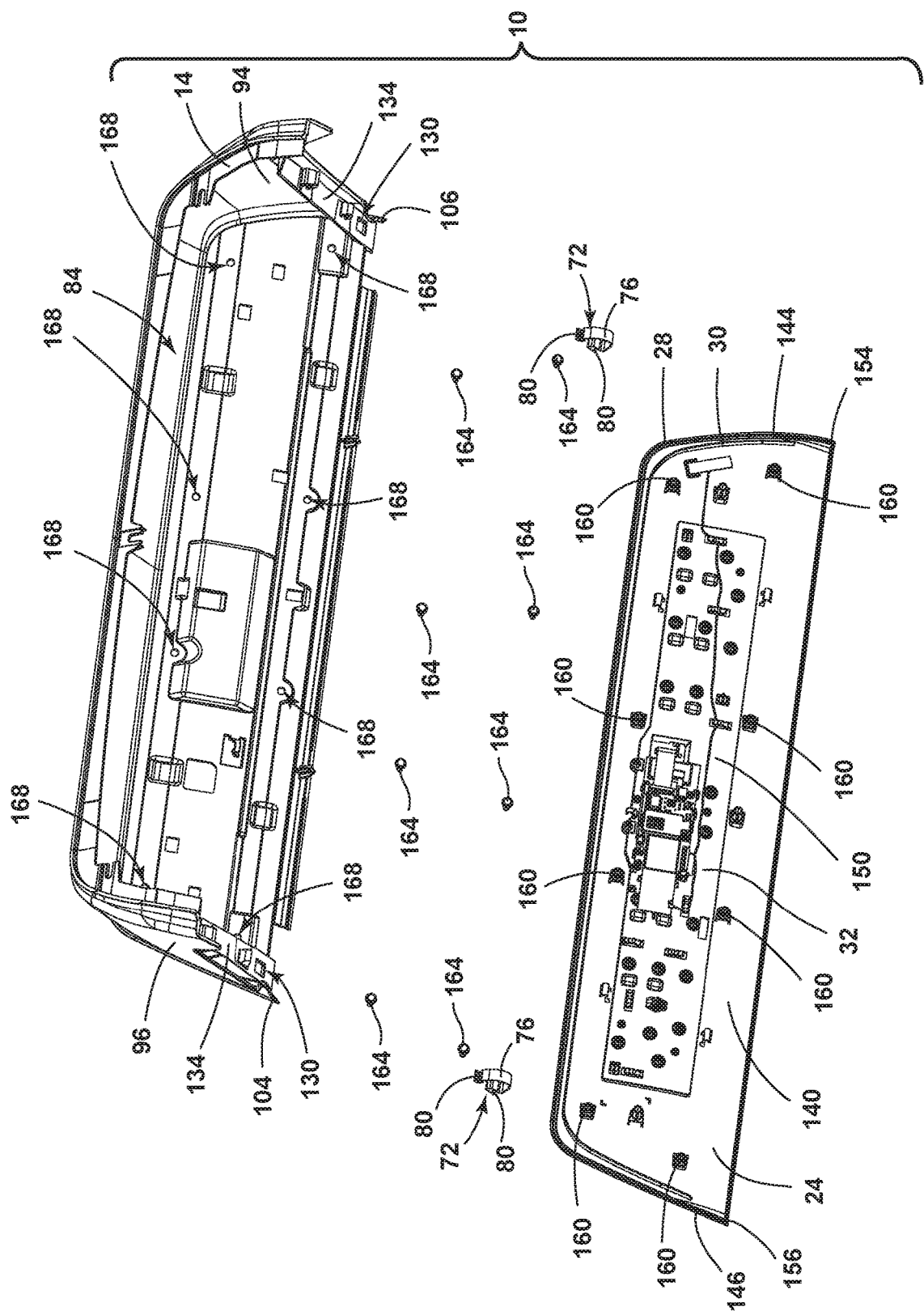
FIG. 4 is an exploded rear perspective view of the console assembly of FIG. 1.

Referring now to FIGS. 3 and 4, the console assembly 10 is shown having the shell 14 and the panel 24. As shown in FIG. 3, the shell 14 includes a body 90 and the first face 16. The body 90 of the shell 14 includes first and second sides 94, 96 joined by the top edge 22 and a rear side 100. The first face 16 may extend between the first and second sides 94, 96. Each of the sides 94, 96 may have a generally triangular or trapezoidal shape such that the first face 16 and the rear side 100 are generally inclined upward toward the top edge 22. According to various examples, the rear side 100 may be a removable panel. In other examples, the rear side 100 may be integrally formed with the first and second sides 94, 96.

Figure 5:
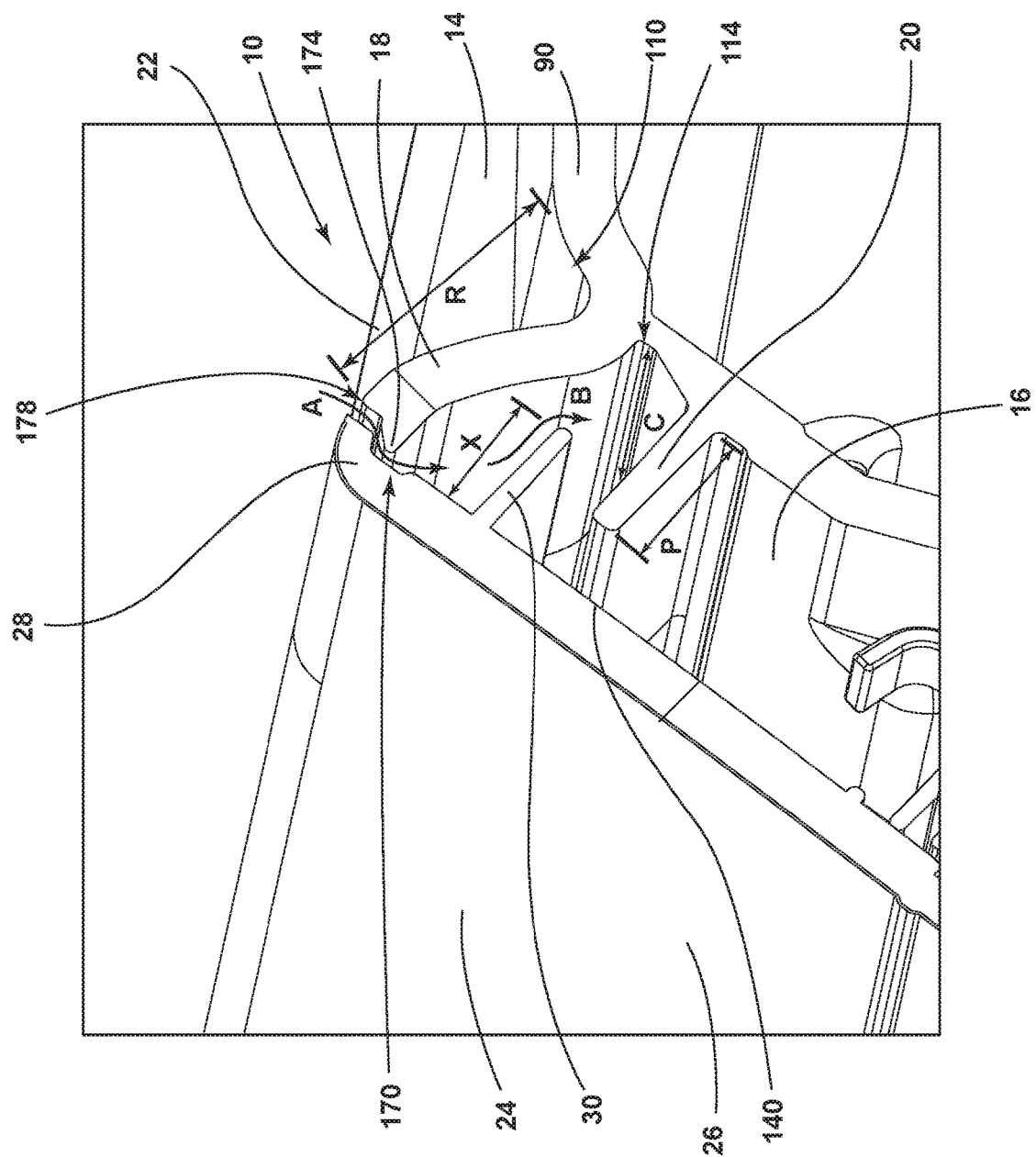
FIG. 5 is a cross-sectional view of the console assembly taken along line V-V of FIG. 1.
Figure 6:
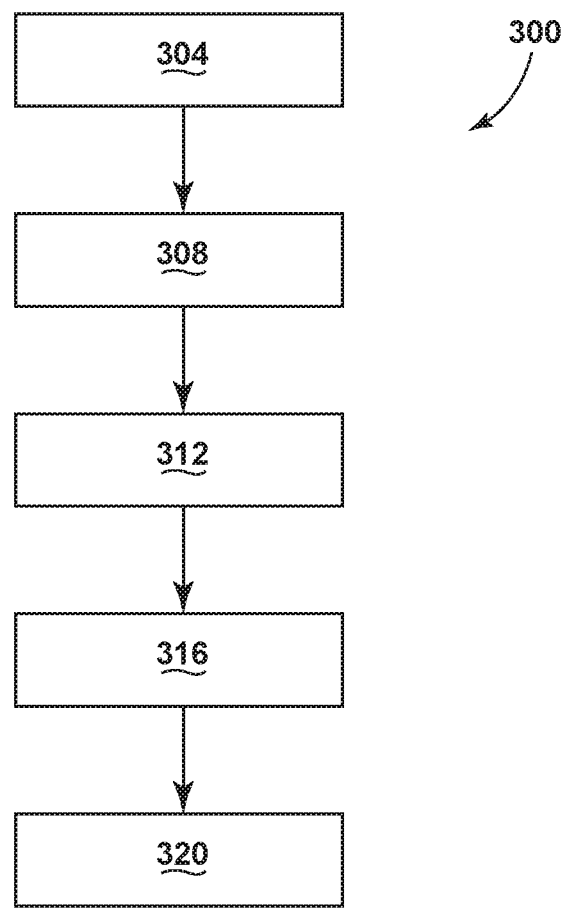
FIG. 6 is a method flow diagram for directing fluid away from electrical components of a console assembly.

As shown in FIGS. 3 and 5, the first rim 18 may extend along a periphery of the first face 16 from a first edge 102 of the body 90 to a second edge 104. The first rim 18 may be aligned with and extend from the top edge 22 of the body 90 of the shell 14. The first rim 18 may extend a first distance R from the body 90 of the shell 14. According to various examples, the first rim 18 may extend at least partially arcuately from the shell 14. In other examples, the first rim 18 may extend linearly from the shell 14. The first rim 18 and the top edge 22 of the body 90 of the shell 14 may define an upper channel 110 extending along an exterior surface of the top edge 22 of the body 90 of the shell 14. In some examples, the upper channel 110 may also extend down the sides 94, 96 of the body 90 of the shell 14.

The first protrusion 20 may extend along first face 16 spaced apart from and generally parallel to the first rim 18. The first protrusion 20 may extend a second distance P from the first face 16 of the shell 14. In various examples, the second distance P may be less than the first distance R such that the first rim 18 extends past the first protrusion 20. In other examples, the second distance P may be greater than the first distance R such that the first protrusion 20 extends past the first rim 18. In still other examples, the second distance P may be substantially equivalent to the first distance R. According to various examples, the first protrusion 20 may extend linearly from the first face 16 of the shell 14. In other examples, the first protrusion 20 may extend at least partially arcuately form the first face 16 of the shell 14 and may curve back toward the first face 16 of the shell 14. In still other examples, the first protrusion 20 may include a bend such that an end of the first protrusion 20 extends outward from the first face 16 of the shell 14 and turns upward toward the top edge 22 of the body 90 of the shell 14 and at an angle relative to the first protrusion 20.

Together, the first rim 18 and the first protrusion 20 define an inner channel 114. The first protrusion 20 may extend substantially perpendicularly from the first face 16. In various examples, the bottom surface of the inner channel 114 may be flush with the first face 16. In other examples, the bottom surface of the inner channel 114 may be further within the shell 14. Where the bottom surface is positioned further within the shell 14, the inner channel 114 may be configured to receive a larger inflow than when the bottom surface of the inner channel 114 is positioned flush with the first face 16 of the shell 14. The incline of the first face 16 may orient the first protrusion 20 such that the first protrusion 20 is inclined back toward the first face 16. This incline orients the inner channel 114 in a generally upward direction and allows fluid to be caught within the inner channel 114 without flowing off the first protrusion 20 and into the console assembly 10.

Both the upper channel 110 and the inner channel 114 may be sloped downward and toward the first and second sides 94, 96 of the body 90 of the shell 14. The upper channel 110 may have a low slope such that the slope is not readily visible to a user. The upper channel 110 may be sloped away from an apex 118 toward the first and second sides 94, 96 of the body 90 of the shell 14.

Similarly, the first protrusion 20 forming the inner channel 114 may be sloped from an apex 120 toward first and second sides 94, 96 of the body 90 of the shell 14. When the first protrusion 20 is proximate the first and second sides 94, 96 of the body 90 of the shell 14, the first protrusion 20 curves and extends downward toward the first and second edges 102, 104 of the body 90 of the shell 14. The curve and slope of the first protrusion 20 are typically congruent with and are configured to complement the shape of the first rim 18 extending about the periphery of the body 90 of the shell 14.

Referring again to FIGS. 3 and 5, the inner channel 114 may follow the first protrusion 20 and may include first and second open ends 124, 126 positioned proximate the first and second edges 102, 104 of the body 90 of the shell 14. The first and second open ends 124, 126 may each be in communication with a drain opening 130. The drain opening 130 may be generally rectangular, circular, or any shape configured to allow fluid to pass through. In various examples, the drain openings 130 may further function as retaining spaces for clips 72 of the console assembly 10. In other examples, the drain openings 130 may be defined by the body 90 of the shell 14. The drain openings 130 may be defined by feet 134 extending inward toward the cavity 88 from the first and second edges 102, 104 of the body 90 of the shell 14.

Referring now to FIGS. 3 and 4, the panel 24 includes the user interface 56 having the plurality of inputs positioned on the second face 26. According to various examples, the panel 24 may be substantially linear. In other examples, a bottom portion of the panel 24 may be curved to allow the panel 24 to smoothly transition with the top panel 44 of the appliance 12 when installed (FIG. 2).

On an opposite side of the panel 24, an inner surface 140 extends from a first side 144 of the panel 24 to a second side 146 of the panel 24. A second portion 150 of the plurality of electrical components 32 may be positioned on and operably coupled to the inner surface 140 of the panel 24. The second portion 150 of the plurality of electrical components 32 may include a controller operably coupled to a printed circuit board. The controller may include a memory having instructions stored thereon that are executable by a processor. The second portion 150 of the plurality of electrical components 32 may be coupled with the user interface 56 such that the user interface 56 is able to provide instructions to the controller based upon a user selection.

The second rim 28 extends about the periphery of the panel 24 from a first edge 154 of the first side 144 of the panel 24 to a second edge 156 of the second side 146 of the panel 24. The second rim 28 may be at least partially radiused (FIG. 5). The second protrusion 30 may extend from the inner surface 140 of the panel 24 and may be positioned congruent with and complementary to the second rim 28. Alternatively, the second protrusion 30 may be positioned parallel to the second rim 28 and may extend from the second rim 28. The second protrusion 30 may extend a distance X from the inner surface 140 of the panel 24. In various examples, the second protrusion 30 may be oriented perpendicular to the inner surface 140. The second protrusion 30 may extend linearly from the inner surface 140 of the panel 24. Alternatively, the second protrusion 30 may extend arcuately from the inner surface 140 of the panel 24 and may curve downward away from the second rim 28.

As shown in FIGS. 3-5, a plurality of receiving wells 160 may be positioned on the inner surface 140 of the panel 24. The receiving wells 160 may be configured to receive fasteners 164. The fasteners 164 may be screws, pins, or any other kind of fastener. When the panel 24 is coupled with the shell 14, the plurality of receiving wells 160 are aligned with a plurality of receiving spaces 168 defined by the first face 16 of the shell 14. In various examples, each receiving well 160 may extend at least partially through the respective receiving space 168. The fasteners 164 are positioned through the receiving spaces 168 and are received by the receiving wells 160 to couple the panel 24 with the shell 14. It will be understood that the shell 14 and panel 24 may be coupled using welding, adhesive, fasteners, snaps, or any other coupling feature. It will also be understood that any combination of coupling features may be used to couple the shell 14 and the panel 24.

As shown in FIG. 5, when the panel 24 is coupled with the shell 14, the inner surface 140 and the second face 26 of the panel 24 are positioned at an incline and parallel to the first face 16. The first and second rims 18, 28 are aligned. According to various examples, the second rim 28 may define a slot 170. The first rim 18 may have a protrusion 174 configured to be at least partially received by the slot 170. The protrusion 174 may be at least partially angular and positioned such that the first rim 18 is received by but not flush with the slot 170. The offset of the protrusion 174 from the slot 170 defines a gap 178 between the first rim 18 and the second rim 28. In other examples, the first rim 18 may be positioned aligned with and spaced apart from the second rim 28, where the second rim 28 may include a first linear edge and the first rim 18 may include a second linear edge. The offset between the linear edges of the first and second rims 18, 28 may define the gap 178.

The second protrusion 30 is at least partially received within the inner channel 114 of the shell 14. When the panel 24 is coupled with the shell 14, the second protrusion 30 is positioned parallel with at least the first protrusion 20. In various examples where the first rim 18 extends linearly from the shell 14, the second protrusion 30 may be positioned parallel to both the first rim 18 and the first protrusion 20. The sum of the distance P spanned by the first protrusion 20 and the distance X spanned by the second protrusion 30 may be calculated to be greater than the distance R spanned by the first rim. This allows the first and second protrusion 20, 30 to overlap to guide fluid into the inner channel 114. In this manner, the first and second protrusions 20, 30 form a labyrinth seal that prevents fluid from infiltrating into the portions of the console assembly 10 containing the electrical components 32.

As shown in FIG. 5 by arrow A, fluid may be able to seep into the console assembly 10 through the gap 178. This may occur when a user wipes down the console assembly 10 for cleaning purposes or in the event of a spill above the console assembly 10. This also may occur where the appliance 12 (FIG. 1) is located outdoors and precipitation and/or condensation occurs, causing fluid to accumulate on the console assembly 10. The fluid may seep through the gap 178 and contact the second protrusion 30. The incline of the second protrusion 30 toward the inner channel 114 may provide the necessary angle to guide the fluid along a path indicated by arrow B. The fluid may flow down the second protrusion 30 and into the inner channel 114. The fluid may be retained in the inner channel 114 by the incline of the first protrusion 20. As shown in FIGS. 3 and 5, the fluid may then flow in a generally downward direction along arrow C toward the sides 94, 96 of the body 90 of the shell 14. The slope of the first protrusion 20 toward the edges 102, 104 of the body 90 of the shell 14 and away from the apex 120 may guide the fluid from the top of the console assembly 10 toward the first and second open ends 124, 126 of the inner channel 114. When the fluid reaches the first and second open ends 124, 126 of the inner channel 114, the fluid may flow through the drain openings 130. According to various examples, the fluid may flow through the drain openings into the cabinet 40 of the appliance 12 when the cabinet 40 does not house electrical components 32 that may be damaged. In other examples, the fluid may flow through a pipe, gutter, channel, or other guide that may be coupled with the drain openings 130. The guide may deposit the fluid exterior of the appliance 12.

Referring now to FIGS. 1-6, a method 300 for directing fluid away from the electrical components 32 of the console assembly 10 may be provided. The method 300 may be used to couple the shell 14 with the panel 24 to form the inner channel 114 for directing fluid away from the electrical components 32. The shell 14 may include the first rim 18 and the first protrusion 20. The panel 24 may include the second rim 28 and the second protrusion 30. The first rim 18 and the first protrusion 20 may define the inner channel 114, as discussed elsewhere herein.

The method 300 may include a step 304 of forming the shell 14 to have the first rim 18 and the first protrusion 20 extending from the first face 16 such that the first rim 18 and the first protrusion 20 define the inner channel 114. The inner channel 114 may be sloped from a center of the shell 14 to sides 94, 96 of the body 90 of the shell 14. The inner channel 114 may be inclined relative to the top edge 22 of the shell 14. The inner channel 114 inclines from the apex 120 towards edges 102, 104 and sides 94, 96 of the body 90 of the shell 14. The method 300 may further include a step 308 of forming the panel 24 to have the second rim 28 and the second protrusion 30.

The method 300 may also include a step 312 of aligning the panel 24 with the shell 14 such that the second rim 28 is proximate the first rim 18 to define the gap 178, and the second protrusion 28 is at least partially received by the inner channel 114 and inclined parallel to the incline of the inner channel 114 and the first face 16. The first rim 18, the first protrusion 20, and the second protrusion 28 may be configured to act as a labyrinth seal to prevent fluid from seeping into the cavity 88 formed by the shell 14. The second protrusion 30 may be at least partially received by the inner channel 114 and may be inclined toward the first face 16 of the shell 14. When the panel 24 is positioned as such, the second protrusion 30 may be oriented parallel to at least the first protrusion 20. The incline of the first protrusion 20 and the second protrusion 30 and the slope of the inner channel 114 allow fluid to flow into the inner channel 114 at any point along the inner channel 114 and still be directed toward the open ends 124, 126 of the inner channel 114. This provides a route to the drain openings 130 for the fluid along the inner channel toward either open end 124, 126.

The method 300 may also include a step 316 of coupling the panel 24 with the shell 14 such that the shell 14 and the panel 24 form said console assembly 10. The panel 24 may be coupled with the first face 16 of the shell 14 using the plurality of fasteners 164. The plurality of fasteners 164 are received by the plurality of receiving wells 160 positioned on the inner surface 140 of the panel 24.

The method 300 may include another step 320 of positioning the plurality of electrical components 32 within the console assembly 10. The plurality of electrical components 32 may be divided into at least first and second portions 84, 150. Each portion 84, 150 may be positioned together within the console assembly 10. Alternatively, each portion 84, 150 may be positioned separately within the console assembly 10. For example, the first portion 84 may be positioned with the cavity 88 of the shell 14 while the second portion 150 is positioned on the inner surface 140 of the panel 24.

In performing the method 300, the first rim 18 is positioned relative to the top edge 22 of the shell 14 such that the upper channel 110 is defined by the top edge 22 of the shell 14. In various examples, the upper channel 110 may mirror the shape of the inner channel 114 and first protrusion 20. In other examples, the upper channel 110 may extend across the top edge 22 of the shell 14 and may be sloped to be congruent with the inner channel 114 towards the sides 94, 96 of the body 90 of the shell 14.

Through operation of the method 300, a fluid path within said console assembly 10 is formed such that the infiltrating fluid seeps through the gap 178 and may be intercepted by the second protrusion 30. Fluid may be applied through cleaning, rainfall, or spillage proximate the console assembly 10. The fluid may flow from the second protrusion 30 into the inner channel 114 and may be routed by the incline and slope of the inner channel 114 and the first protrusion 20 away from the plurality of electrical components 32. This may prevent damage to the electrical components 32 and may eliminate the need for one or more seals in the console assembly 10.

In various aspects of the device, the shell 14 is formed such that the first face 16 is inclined toward the top edge 22 of the shell 14 and the first protrusion 20 is angled upward relative to the first face 16 and is configured to prevent fluid from flowing off the first protrusion 20 when the fluid is in the inner channel 114. This prevents fluid from leaking from the inner channel 114 and into the cavity 88 of the shell 14 where the fluid could damage the plurality of electrical components 32. It is contemplated, although the steps are listed in a particular order, they may be performed in any order or with two or more steps being performed concurrently without departing from the scope of the present disclosure.

The console assembly 10 utilizes the inner channel 114 to protect the electrical components 32 of the appliance 12. The rerouting or deflecting of the fluid away from the electrical components 32 prevents damage to the electrical components 32. The use of the inner channel 114 further eliminates the need for a seal, which may leak or fail over time. The elimination of the seal further provides potential cost savings in manufacturing of the appliance 12.

According to one aspect, an appliance may be provided that may include a body including a top panel. A console assembly may be operably coupled to the top panel of the body. The console assembly may include a shell defining a cavity. The shell may include a first rim and a first protrusion. The first rim and the first protrusion may define a channel. A panel may be operably coupled with the shell. The panel may include a second protrusion. The second protrusion may be aligned with the first rim and the first protrusion and may be positioned within the channel. A plurality of electrical components may be positioned on one of the shell and the panel.

According to still other aspects, the shell may include a body portion operably coupled with a first face. The first face may be positioned at an incline relative to the top panel.

According to yet another aspect, the channel may extend from a first side of the first face to a second side of the first face.

According to still another aspect, a drain opening may be defined by the shell at one end of the channel.

According to other aspects, the panel may further include a second rim positioned proximate the first rim. The first and second rims may define a gap.

According to another aspect, the first rim extend arcuately from the shell.

According to still other aspects, the first protrusion may include a first side portion and a second side portion. The first and second side portions may be sloped downward from a center point.

According to yet another aspect, a console assembly for an appliance may be provided that may include a shell having a first face and a first rim and a first protrusion operably coupled with the first face. The first face may be positioned at an incline relative to a top edge of the shell. A panel may be operably coupled with the shell. The shell may include a second face and a second rim and a second protrusion extending from a side of the panel opposite the second face. The panel may be positioned parallel to the first face. A plurality of electrical components may be operably coupled to one of the shell and the panel.

According to still another aspect, a first portion of the plurality of electrical components may be positioned within the shell.

According to another aspect, the second face of the panel may include a plurality of user inputs coupled with a second portion of the plurality of electrical components.

According to still other aspects, the second portion of the plurality of electrical components may be positioned on one of the first face of the shell and an inner surface of the panel.

According to yet another aspect, the first rim may be positioned proximate the second rim. The first and second rims may define a gap.

According to other aspects, the first rim and the first protrusion may extend from a first end of the first face to a second end of the first face.

According to still other aspects, the first rim and the first protrusion may define a channel. The second protrusion may be at least partially received within the channel.

According to another aspect, the shell may include a body portion. The body portion may define a drain opening proximate one end of the channel.

According to another aspect, the incline of the first face may be configured to guide fluid from the top edge of the shell and along the channel.

According to other aspects, a method for deflecting fluid away from electrical components of a console assembly may be provided. The method may include a step of forming a shell to have a first rim and a first protrusion extending from a first face such that the first rim and first protrusion define a first channel. The channel may be sloped from a center of the shell to sides of the shell and may be inclined relative to a top edge of the shell. The method may also include a step of forming a panel to have a second rim and a second protrusion. The method may further include a step of aligning the panel with the shell such that the second rim is proximate the first rim to define a gap and the second protrusion is at least partially received by the first channel and inclined parallel to the incline of the first channel. The first rim, the first protrusion, and the second protrusion may be configured to act as a labyrinth seal. The method may also include a step of coupling the panel with the shell such that the shell and the panel form said console assembly. The method may include another step of positioning a plurality of electrical components within said console assembly.

According to another aspect, the method may further include a step of positioning the first rim relative to the first rim such that a protrusion of the first rim is aligned within a slot of the second rim to define the gap.

According to yet another aspect, the method may include another step of forming a fluid path within said console assembly such that the infiltrating fluid seeps through the gap and is intercepted by the second protrusion. The fluid may flow from the second protrusion into the first channel. The fluid may be routed by the incline of the first channel away from the electrical components.

According to still other aspects, the method may also include a step of forming the shell such that the first face is inclined toward the top edge of the shell and the first protrusion is angled upward relative to the first face and is configured to prevent fluid from flowing off the first protrusion.

It will be understood by one having ordinary skill in the art that construction of the described concepts, and other components, is not limited to any specific material. Other exemplary embodiments of the concepts disclosed herein may be formed from a wide variety of materials unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures and/or members or connector or other elements of the system may be varied, and the nature or numeral of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes, or steps within described processes, may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further, it is to be understood that such concepts are intended to be covered by the following claims, unless these claims, by their language, expressly state otherwise.

It is to be understood that variations and modifications can be made on the aforementioned structure without departing from the concepts of the present disclosure, and further it is to be understood that such concepts are intended to be covered by the following claims unless these claims by their language expressly state otherwise.

What is claimed is:

1. An appliance comprising:
    a body including a top panel; and
    a console assembly operably coupled to the top panel of the body, the console assembly comprising:
        a shell including a body and defining a cavity, wherein the shell further includes a first rim and a first protrusion, the first rim and the first protrusion defining a channel, wherein an end of the channel is in communication with a drain opening defined by the body of the shell;
        a panel operably coupled with the shell, the panel including a second protrusion, wherein the second protrusion is aligned with the first rim and the first protrusion and positioned within the channel; and
        a plurality of electrical components positioned on one of the shell and the panel.

2. The appliance of claim 1, wherein the shell includes a first face positioned at an incline relative to the top panel.

3. The appliance of claim 2, wherein the channel extends from a first side of the first face to a second side of the first face.

4. The appliance of claim 1, wherein the panel further includes a second rim positioned proximate the first rim, the first and second rims defining a gap.

5. The appliance of claim 1, wherein the first rim extends arcuately from the shell.

6. The appliance of claim 5, wherein the first protrusion includes a first side portion and a second side portion, and further wherein the first and second side portions are sloped downward from a center point.

7. A console assembly for an appliance, the console assembly comprising:
    a shell having a first rim and a first protrusion operably coupled with a first face, wherein the shell includes a body portion defining a drain opening and the first face is positioned at an incline relative to a top edge of the shell, and further wherein the first rim and the first protrusion define a channel and the drain opening is defined proximate one end of the channel;
    a panel operably coupled with the shell and including a second face, the panel positioned parallel to the first face, wherein a second rim and a second protrusion extend from a side of the panel opposite the second face and the second protrusion is at least partially received within the channel; and
    a plurality of electrical components operably coupled to one of the shell and the panel.

8. The console assembly of claim 7, wherein the incline of the first face is configured to guide fluid from the top edge of the shell and along the channel.

9. The console assembly of claim 7, wherein a first portion of the plurality of electrical components are positioned within the shell.

10. The console assembly of claim 7, wherein the second face of the panel includes a plurality of user inputs coupled with a second portion of the plurality of electrical components.

11. The console assembly of claim 10, wherein the second portion of the plurality of electrical components is positioned on one of the first face of the shell and an inner surface of the panel.

12. The console assembly of claim 7, wherein the first rim is positioned proximate the second rim, and further wherein the first and second rims define a gap.

13. The console assembly of claim 7, wherein the first rim and the first protrusion extend from a first end of the first face to a second end of the first face.

14. A method for directing fluid away from electrical components of a console assembly, the method comprising steps of:
    forming a shell to have a first rim and a first protrusion extending from a first face such that the first rim and first protrusion define a channel, the channel sloped from a center of the shell to sides of the shell and inclined relative to a top edge of the shell;
    forming a panel to have a second rim and a second protrusion;
    aligning the panel with the shell such that the second rim is proximate the first rim to define a gap and the second protrusion is at least partially received by the channel and inclined parallel to an incline of the channel, wherein the first rim, the first protrusion, and the second protrusion are configured to act as a labyrinth seal;

coupling the panel with the shell such that the shell and the panel form said console assembly;

positioning a plurality of electrical components within said console assembly; and forming a fluid path within said console assembly such that the infiltrating fluid seeps through the gap and is intercepted by the second protrusion, wherein the fluid flows from the second protrusion into the channel and is routed by the incline of the channel away from the electrical components.

15. The method of claim 14, further comprising a step of:

positioning the second rim relative to the first rim such that a protrusion of the first rim is aligned within a slot of the second rim to define the gap.

16. The method of claim 14, further comprising a step of:

forming the shell such that the first face is inclined toward the top edge and the first protrusion is angled upward relative to the first face and is configured to prevent fluid from flowing off the first protrusion.

\* \* \* \* \*